(12) United States Patent
Chang et al.

(10) Patent No.: US 10,685,161 B2
(45) Date of Patent: Jun. 16, 2020

(54) REGION BASED SHRINKING METHODOLOGY FOR INTEGRATED CIRCUIT LAYOUT MIGRATION

(71) Applicant: TAIWAN SEMICONDUCTOR MANUFACTURING COMPANY LTD., Hsinchu (TW)

(72) Inventors: Chi-Wen Chang, Hsinchu (TW); Jui-Feng Kuan, Zhubei (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 15 days.

(21) Appl. No.: 16/204,844

(22) Filed: Nov. 29, 2018

(65) Prior Publication Data
US 2020/0057834 A1 Feb. 20, 2020

Related U.S. Application Data

(60) Provisional application No. 62/720,047, filed on Aug. 20, 2018.

(51) Int. Cl.
- *G06F 17/50* (2006.01)
- *G06F 30/392* (2020.01)
- *G06F 30/398* (2020.01)

(52) U.S. Cl.
CPC .......... *G06F 30/392* (2020.01); *G06F 30/398* (2020.01)

(58) Field of Classification Search
CPC .. G06F 17/50; G06F 17/5072; G06F 17/5081; G06F 17/5068; G06F 17/5022; G06F 17/5045; G06F 2217/66; G06F 30/392; G06F 30/398; H01L 27/0207
See application file for complete search history.

(56) References Cited

U.S. PATENT DOCUMENTS

| | | | | |
|---|---|---|---|---|
| 2007/0276770 A1* | 11/2007 | Fu | .......................... | G06Q 10/04 705/400 |
| 2008/0296700 A1* | 12/2008 | Kang | .............. | H01L 21/823437 257/390 |
| 2012/0084745 A1* | 4/2012 | Liu | ..................... | G06F 17/5022 716/127 |
| 2012/0210283 A1* | 8/2012 | Li | ....................... | G06F 17/5018 716/112 |
| 2015/0213177 A1* | 7/2015 | De Dood | ............ | G06F 17/5068 716/122 |

* cited by examiner

*Primary Examiner* — Vuthe Siek
(74) *Attorney, Agent, or Firm* — Hauptman Ham, LLP

(57) ABSTRACT

A method of modifying an integrated circuit (IC) design layout is provided. The method includes receiving a first IC design layout having first gate layout patterns and first interconnect layout patterns. Second gate layout patterns for a second IC design layout are then obtained from the first gate layout patterns according to a set of design rules associated with a technology node different from that of the first IC design layout. After determining scaling factors for the first IC design layout based on the first gate layout patterns and the second gate layout patterns such that each scaling factor corresponds to one of at least one shrinkable region and at least one non-shrinkable region in the first IC design layout, the first interconnect layout patterns are adjusted using the scaling factors to determine second interconnect layout patterns for the second IC design layout.

20 Claims, 7 Drawing Sheets

US 10,685,161 B2

REGION BASED SHRINKING METHODOLOGY FOR INTEGRATED CIRCUIT LAYOUT MIGRATION

BACKGROUND

In order to incorporate more functions and achieve better performance at a reduced cost, integrated circuits (ICs) are formed with increasingly smaller dimensions. In the semiconductor industry, as more advanced processes use smaller feature sizes, an IC design layout is often migrated from one fabrication process to a different, more advanced fabrication process. The layout migration permits reuse of an existing layout that has been optimized for a given technology, rather than having to design the layout anew, due to time-to-market and manufacturing cost considerations.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions and spatial relationship(s) of the various features may be arbitrarily enlarged or reduced for clarity. Like reference numerals denote like features throughout specification and drawings.

DETAILED DESCRIPTION

Figure 1:
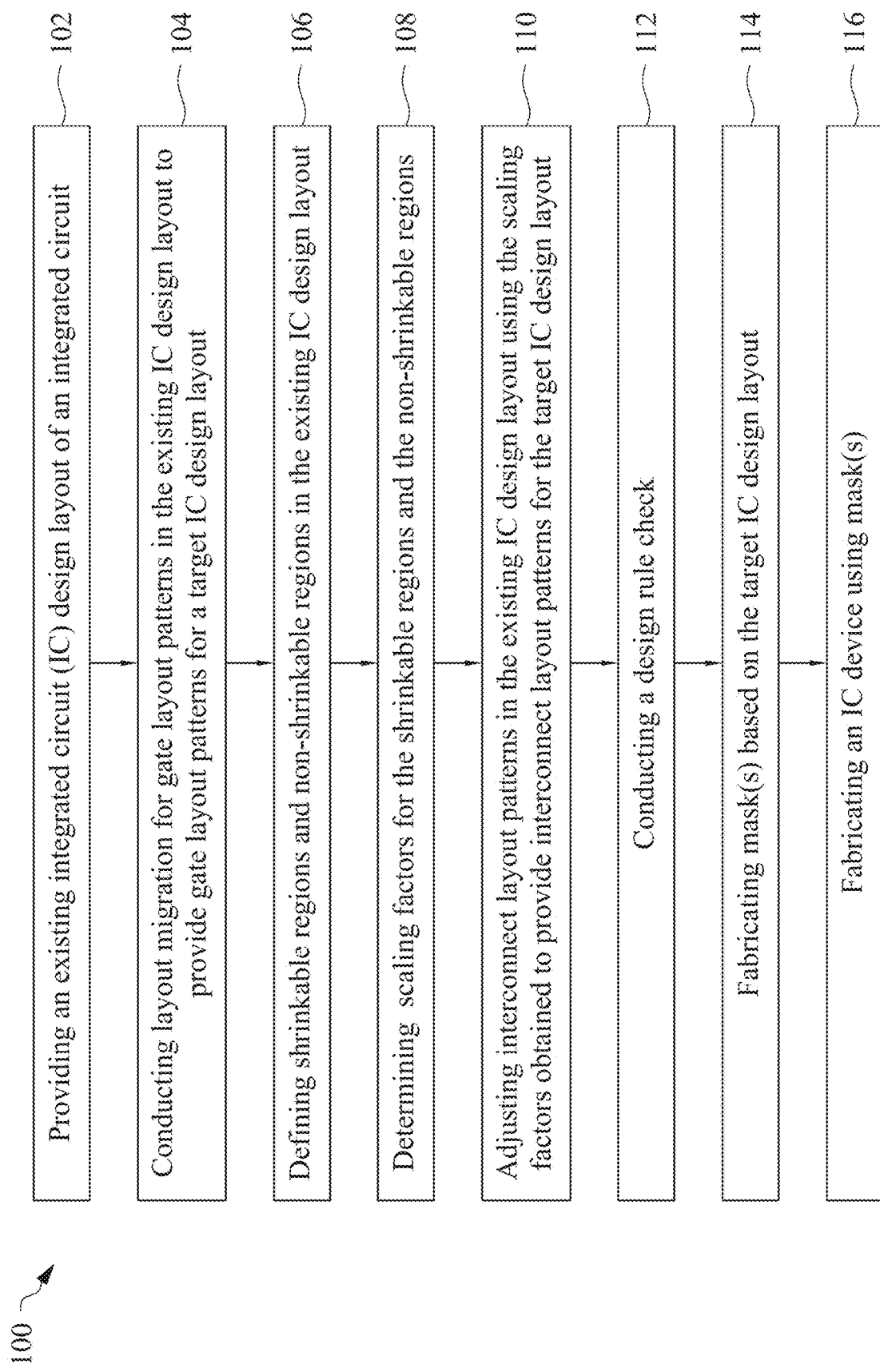
FIG. 1 is a flow chart of a method of migrating an integrated circuit (IC) design layout, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

When an IC design layout is migrated to a newer fabrication process, the physical dimensions of features in the IC design layout are scaled down to achieve a smaller chip size or footprint and better performance. In some instances, a linear shrink approach is used for converting an existing IC design layout to a newer or different technology node. With a linear shrink approach, all layout features are reduced linearly by applying a uniform scaling factor that is defined by the size ratio of the new technology node to the old technology node across the entire design. As a result, the x-dimension and y-dimension of the layout patterns in the existing IC design layout are scaled by the same percentage. For example, when the scaling factor is 10%, the x-dimension of all the layout patterns in the existing IC design layout are scaled by 10%, and the y-dimension of all the layout patterns in the existing IC design layout are scaled by 10%. However, because the performance of circuits is often related to feature sizes, there are features in an IC design layout that are not scaled. For example, analog circuits and some high-speed integrated circuits maintain original sizes in order to maintain performance unchanged throughout different generations of integrated circuits. In some instances, the linear shrink approach universally scales down the dimension of every feature in shrinkable circuits and non-shrinkable circuits, and designers then adjust the sizes of features in the non-shrinkable circuits so that the dimensions and relative positions of features in the non-shrinkable circuits after layout migration are corrected. This is usually performed manually and potentially creates a large number of errors. In order to help reduce errors, in some embodiments, a method includes altering the sizes of features in shrinkable circuits while maintaining the sizes of features in non-shrinkable circuits when performing layout migration.

In some embodiments, the present disclosure provides a method that allows a non-uniform shrinking of an existing IC design layout that is designed for fabrication by one manufacturing process to provide a target design layout that is designed for fabrication by another, typically more advanced, manufacturing process. The method includes determining scaling factors for different regions for an existing design layout, for example, first in the x direction, and then in the y direction, by comparing gate layout patterns in the existing IC design layout and gate layout patterns in the target IC design layout, scaling remaining layout patterns in the existing IC design layout according to the scaling factors, and adjusting the layout patterns for design rule compliance. By using different scaling factors for shrinkable and non-shrinkable regions and shrinking layout patterns in the shrinkable regions while maintaining the size of layout patterns in the non-shrinkable region, an amount of effort for correcting a layout after migration is reduced. Non-uniform shrinking also helps to reduce design rule check (DRC) errors. For example, a 90% reduction in DRC errors is achieved using the regional shrinking method of the present disclosure when compared to a uniform shrinking method.

Figure 2:
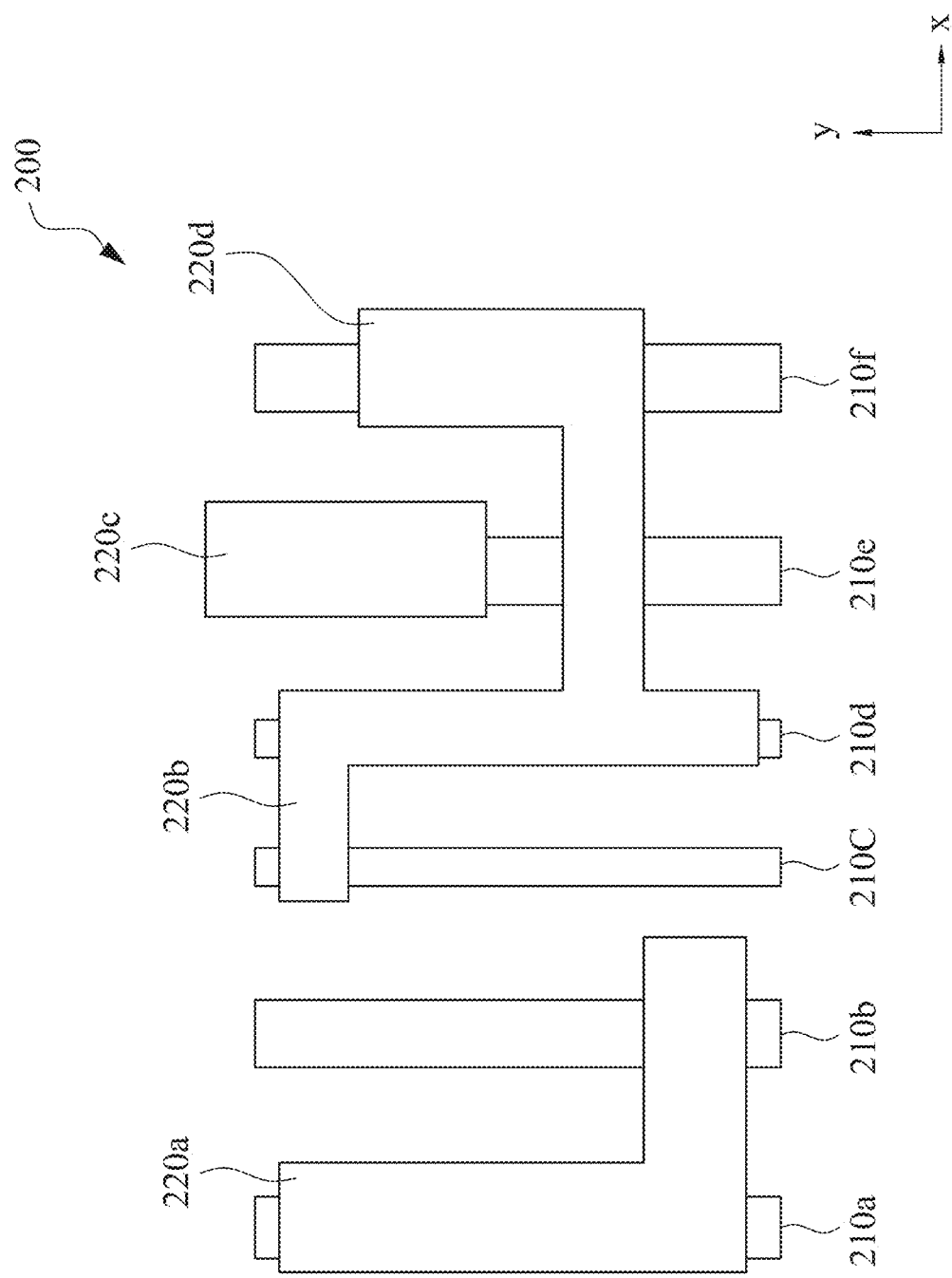
FIG. 2 is a plan view of an existing IC design layout that is associated with a first technology node in accordance with some embodiments.
Figure 4:
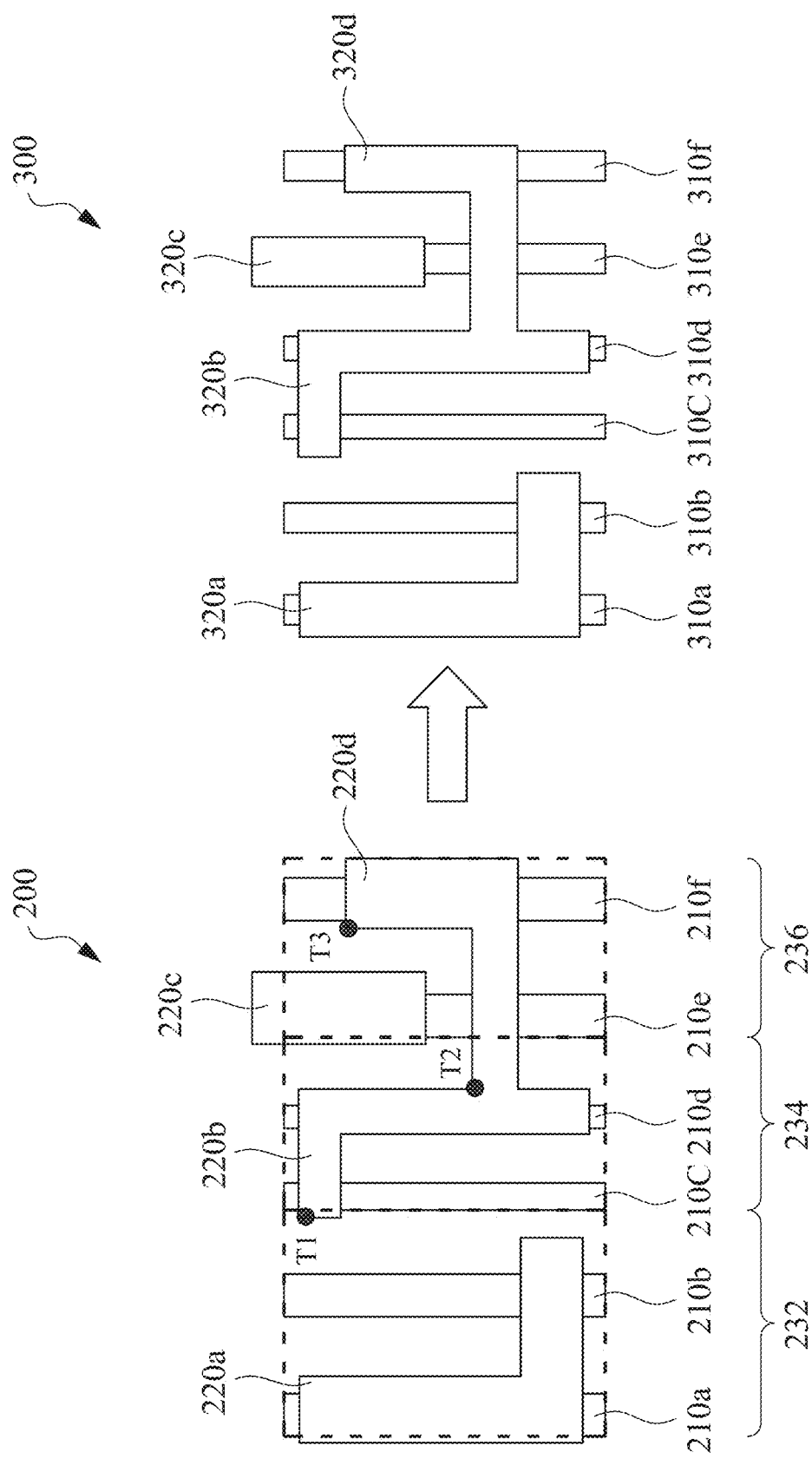
FIG. 4 is a diagram of adjusting interconnect layout patterns, in accordance with some embodiments.
Figure 5:
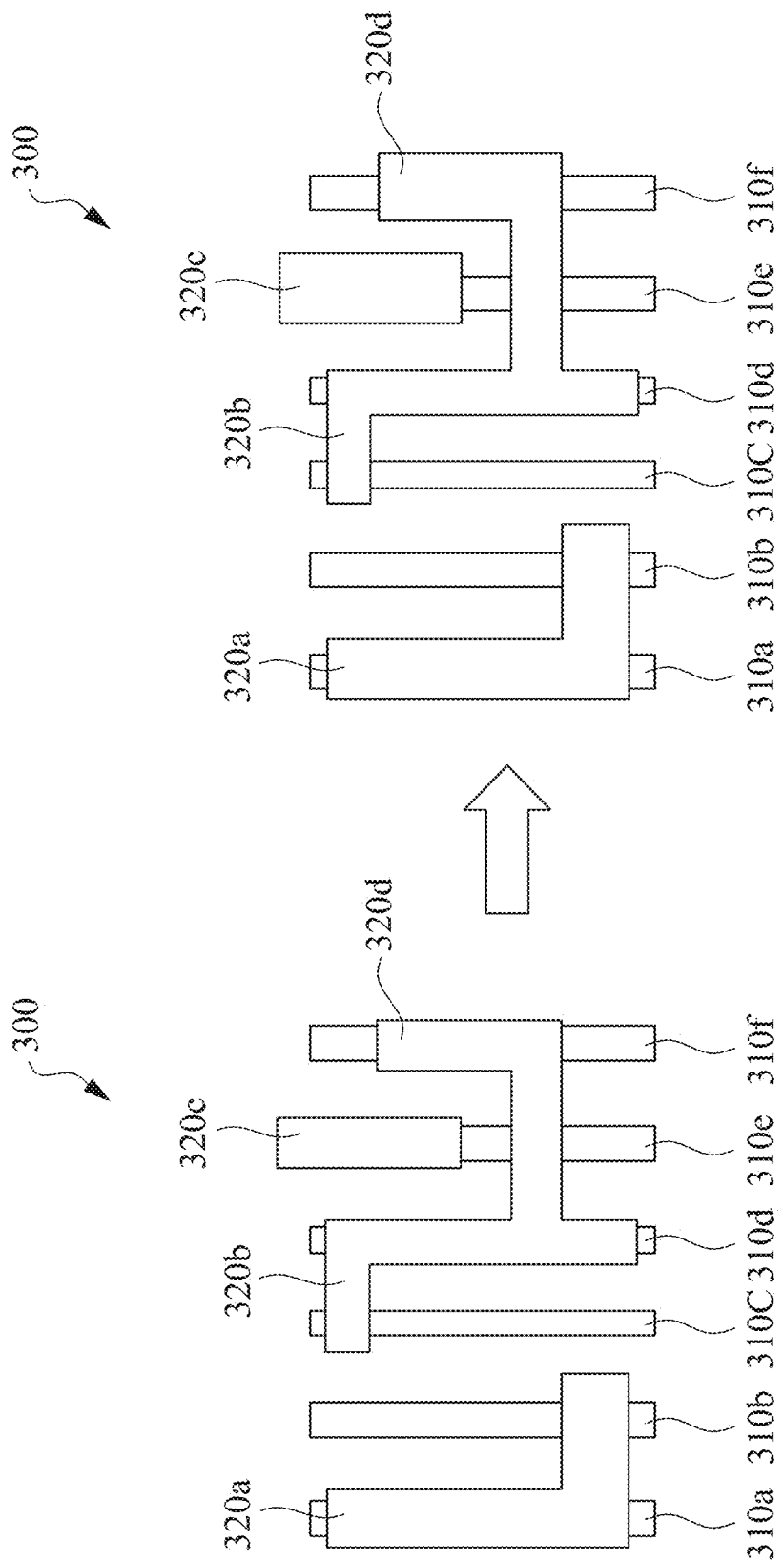
FIG. 5 is a diagram of conducting design rule check on the target interconnect layout patterns, in accordance with some embodiments.

FIG. 1 is a flow chart of a method 100 of migrating an existing integrated circuit (IC) design layout, e.g., IC design layout 200 in FIG. 2, associated with a first technology node to a target IC design layout, e.g., IC design layout 300 in FIG. 5, associated with a second technology node, in accordance with some embodiments. In some embodiments, method 100 is capable of being performed as part of a method of forming IC design layout 300 from IC design layout 200 discussed below with respect to FIGS. 2-5. In some embodiments, additional operations are performed before, during, and/or after the method 100 depicted in FIG. 1, and some other processes are briefly described herein. Some or all of the operations of method 100 are capable of being performed as part of a design procedure performed in a design house, e.g., a design house 720 discussed below with respect to FIG. 7.

Referring to FIG. 1 and FIG. 2, in operation 102 of method 100, an existing IC design layout, i.e., IC design layout 200 that is associated with a first technology node is provided. IC design layout 200 includes overlapping layout patterns from various layout layers of IC design layout 200. The layout patterns correspond to various IC features, such as diffusion regions, gate electrodes, source and drain regions, metal lines or vias of interconnection layers, and openings for bonding pads, to be formed in a semiconductor substrate and various material layers disposed on the semiconductor substrate. Some layout patterns and some layout layers of IC design layout 200 are simplified or omitted. IC design layout 200 is a non-limiting example for facilitating explanation of method 100.

IC design layout 200 includes a plurality of gate layout patterns 210a, 210b, 210c, 210d, 210e and 210f over one or more diffusion region layout patterns (not shown), and a plurality of interconnect layout patterns 220a, 220b, 220c and 220d over the plurality of gate layout patterns 210a, 210b, 210c, 210d, 210e and 210f. Interconnect layout patterns 220a, 220b, 220c and 220d represent interconnect layout patterns in a first interconnect layout layer in IC design layout 200. In FIG. 2, the plurality of gate layout patterns has six gate layout patterns, and the plurality of interconnect layout patterns has four interconnect layout patterns. The plurality of gate layout patterns is not limited to a specific number. In some embodiments, the plurality of gate layout patterns has more or less than six gate layout patterns. The plurality of interconnect layout patterns is not limited to a specific number. In some embodiments, the plurality of interconnect layout patterns has more or less than four interconnect layout patterns. Also, IC design layout 200 is not limited to a specific number of interconnect layout layers, and additional interconnect layout layers are contemplated.

Gate layout patterns 210a, 210b, 210c, 210d, 210e and 210f extend along a y direction and are separated from one another along an x direction. Each gate layout pattern 210a, 210b, 210c, 210d, 210e or 210f has a width along the x direction and a length along the y direction. In some embodiments, the x direction is substantially perpendicular to the y direction. In some embodiments, the y direction is a vertical direction and the x direction is a horizontal direction. In some embodiments, the y direction is a horizontal direction and the x direction is a vertical direction. The width of each gate layout pattern 210a, 210b, 210c, 210d, 210e or 210f and the spacing between every adjacent gate layer patterns 210a, 210b, 210c, 210d, 210e and 210f is governed by a set of design rules associated with a manufacturing process that is used to manufacture IC design layout 200. Gate layout patterns 210a, 210b, 210c, 210d, 210e and 210f are usable to form a plurality of hard mask features or gate electrode features from which a plurality of gate electrodes is made.

Interconnect layout patterns 220a, 220b, 220c and 220d are usable to form a plurality of hard mask features or interconnect structure features from which a plurality of interconnect structures electrically connected to the gate electrodes of transistors is made. In some embodiments, interconnect layout pattern 220a is configured to overlap gate layout pattern 210a and gate layout pattern 210b, interconnect layout pattern 220b is configured to overlap gate layout pattern 210c and gate layout pattern 210d, interconnect layout 220c is configured to overlap gate layout pattern 210e, and interconnect layout pattern 220d is configured to overlap gate layout pattern 210e and gate layout pattern 210f. In some embodiments, interconnect layout pattern 220d is also configured to be in contact with interconnect layout pattern 220b. Interconnect layout patterns 220a, 220b, 220c and 220d include any suitable shape for providing electrical connection to desired gate layout patterns 210a, 210b, 210c, 210d, 210e and 210f. In some embodiments, interconnect layout patterns 220a, 220b and 220d are L-shaped, and interconnect layout pattern 220c is rectangular-shaped.

Figure 3:
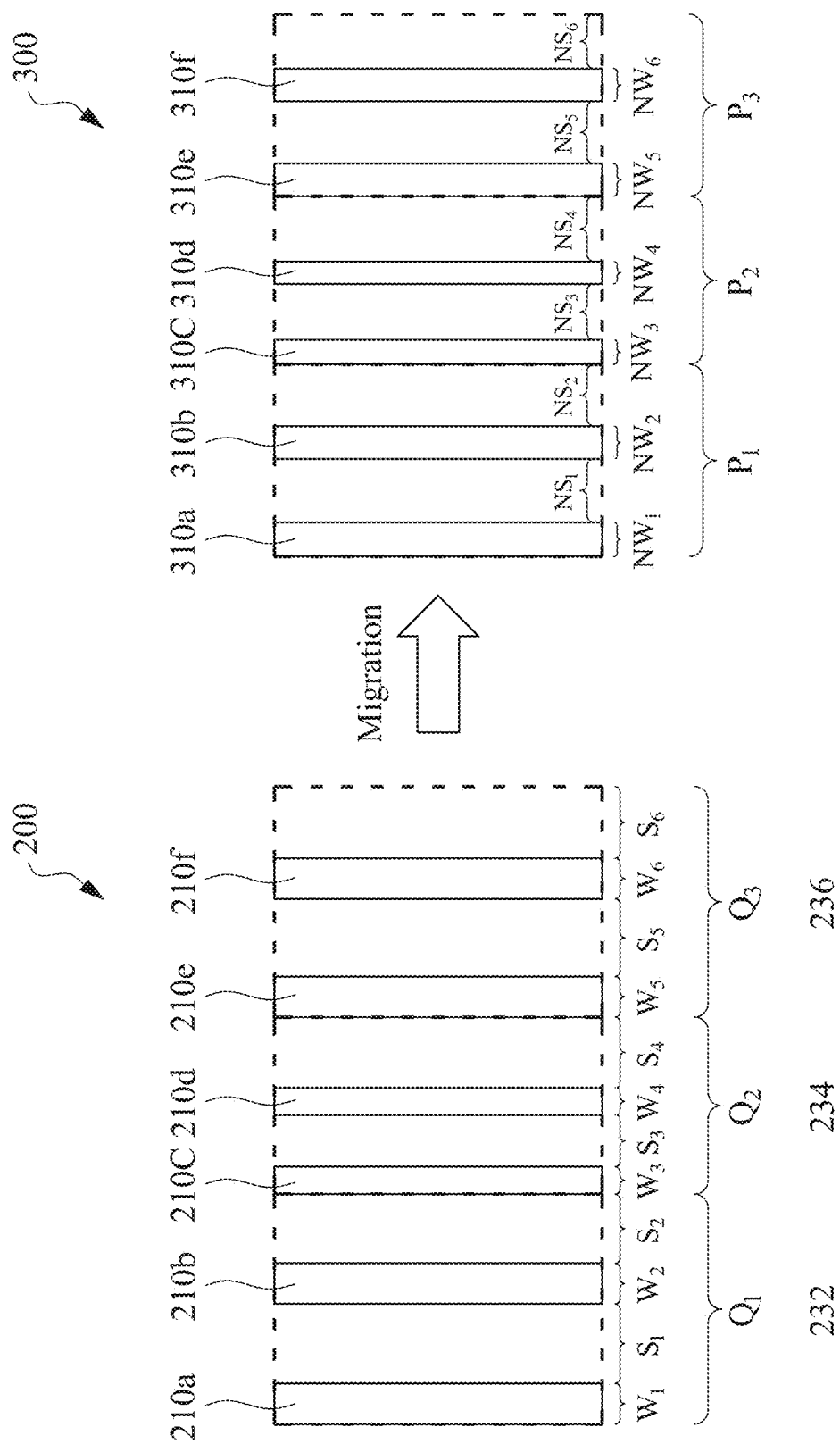
FIG. 3 is a diagram of generating target gate layout patterns, in accordance with some embodiments.

Referring to FIG. 1 and FIG. 3, in operation 104 of method 100, the plurality of gate layout patterns 210a, 210b, 210c, 210d, 210e and 210f undergoes layout migration to generate a plurality of gate layout patterns 310a, 310b, 310c, 310d, 310e and 310f for a target IC design layout 300. IC design layout 300 is associated with a second technology node, which is smaller than the first technology node. A shrinking algorithm is iteratively performed on all of gate layout patterns 210a, 210b, 210c, 210d, 210e and 210f in IC design layout 200 and a pre-defined scaling table is queried to adjust widths, lengths of gate layout patterns 210a, 210b, 210c, 210d, 210e and 210f, and spacings between gate layout patterns 210a, 210b, 210c, 210d, 210e and 210f, so as to provide gate layout patterns 310a, 310b, 310c, 310d, 310e and 310f with width, lengths and spacings governed by a set of predetermined design rules that are used to manufacture a target integrated circuit. For simplicity, FIG. 3 includes the migration of gate layout patterns 210a, 210b, 210c, 210d, 210e and 210f in the x direction; one of ordinary skill in the art would understand a similar migration is performed in the y direction.

Still referring to FIG. 2 and FIG. 3, in operation 106 of method 100, regions that correspond to shrinkable regions (e.g., regions 232 and 236) and non-shrinkable regions (e.g., region 234) in IC design layout 200 are defined by comparing widths of gate layout pattern patterns 210a, 210b, 210c, 210d, 210e and 210f in IC design layout 200 with widths of corresponding gate layout patterns 310a, 310b, 310c, 310d, 310e and 310f for IC design layout 300, and spacings between adjacent gate layout pattern patterns 210a, 210b, 210c, 210d, 210e and 210f in IC design layout 200 with spacings between corresponding adjacent gate layout patterns 310a, 310b, 310c, 310d, 310e and 310f for IC design layout 300, respectively. In FIG. 3, respective widths of gate layout patterns 210a, 210b, 210c, 210d, 210e and 210f in IC design layout 200 are represented by $W_1$, $W_2$, $W_3$, $W_4$, $W_5$ and $W_6$, and respective spacings between layout patterns 210a, 210b, 210c, 210d, 210e and 210f in IC design layout 200 are represented by $S_1$, $S_2$, $S_3$, $S_4$ and $S_5$. After the layout migration, respective widths of gate layout patterns 310a, 310b, 310c, 310d, 310e and 310f for IC design layout 300 are represented by $NW_1$, $NW_2$, $NW_3$, $NW_4$, $NW_5$ and $NW_6$, respectively, and respective spacings between layout patterns 310a, 310b, 310c, 310d, 310e and 310f for IC design layout 300 are represented by $NS_1$, $NS_2$, $NS_3$, $NS_4$ and $NS_5$.

More specifically, a width of each gate layout pattern 210a, 210b, 210c, 210d, 210e or 210f in IC design layout 200 is compared with a width of a corresponding gate layout pattern 310a, 310b, 310c, 310d, 310e or 310f for IC design layout 300 and a spacing between every two adjacent gate layout patterns 210a, 210b, 210c, 210d, 210e and 210f in IC design layout 200 is compared with a spacing between every two adjacent corresponding gate layout patterns 310a, 310b, 310c, 310d, 310e and 310f for IC design layout 300, so as to determine which gate layout patterns in gate layout patterns 210a, 210b, 210c, 210d, 210e and 210f are being shrunk and which gate layout patterns in gate layout patterns 210a, 210b, 210c, 210d, 210e and 210f remain the same after layout migration. That is, the width $W_1$ of gate layout pattern 210a is compared with the width $NW_1$ of gate layout pattern 310a, the width $W_2$ of gate layout pattern 210b is compared with the width $NW_2$ of gate layout pattern 310b, the width $W_3$ of gate layout pattern 210c is compared with the width $NW_3$ of gate layout pattern 310c, the width $W_4$ of gate layout pattern 210d is compared with the width $NW_4$ of gate layout pattern 310d, the width $W_5$ of gate layout pattern 210e is compared with the width $NW_5$ of gate layout pattern 310e, and the width $W_6$ of gate layout pattern 210f is compared with the width $NW_6$ of gate layout pattern 310f. Similarly, the spacing $S_1$ between gate layout pattern 210a and gate layout pattern 210b is compared with the spacing $NS_1$ between gate layout pattern 310a and gate layout pattern 310b, the spacing $S_2$ between gate layout pattern 210b and gate layout pattern 210c is compared with the spacing $NS_2$ between gate layout pattern 310b and gate layout pattern 310c, the spacing $S_3$ between gate layout pattern 210c and gate layout pattern 210d is compared with the spacing $NS_3$ between gate layout pattern 310c and gate layout pattern 310d, the spacing $S_4$ between gate layout pattern 210d and gate layout pattern 210e is compared with the spacing $NS_4$ between gate layout pattern 310d and gate layout pattern 310e, and the spacing $S_5$ between gate layout pattern 210e and gate layout pattern 210d is compared with the spacing $NS_5$ between gate layout pattern 310e and gate layout pattern 310f.

After the comparison is completed, adjacent gate layout patterns, e.g., gate layout patterns 210a, 210b, 210e and 210f, which have the same degree of dimension (width and spacing) changes are grouped together to define a shrinkable region, while adjacent gate layout patterns, e.g., gate layout patterns 210c and 210d, which have no dimension (i.e., width and spacing) changes are grouped together to define a non-shrinkable region. In some embodiments, assuming after layout migration, in IC design layout 200 width $W_1$, spacing $S_1$, width $W_2$ and spacing $S_2$ are reduced by a first percentage, width $W_3$, spacing $S_3$, width $W_4$ and spacing $S_4$ remain the same, and width $W_5$, spacing $S_5$, and width $W_6$ and spacing $S_6$ are reduced by a second percentage, three different regions are defined in IC design layout 200. The first region 232 is a shrinkable region comprising gate layout pattern 210a and gate layout pattern 210b where respective pitches of gate layout patterns 210a and 210b are scaled by the same degree, the second region 234 is a non-shrinkable region comprising gate layout pattern 210c and gate layout pattern 210d where respective pitches of gate layout patterns 210c and 210d stay the same, and the third region 236 is a shrinkable region comprising gate layout pattern 210e and gate layout pattern 210f where respective pitches of gate layout patterns 210e and 210f are scaled by the same degree, which is the same or different from the degree of scaling for the first shrinkable region 232. As used herein, a pitch of a gate layout pattern is measurable as a summation of a width of the gate layout pattern and a spacing between the gate layout pattern and an adjacent gate layout pattern. Although three regions are included and described in FIG. 3, any numbers of shrinkable regions and non-shrinkable regions are contemplated in IC design layout 200.

Still referring to FIG. 2 and FIG. 3, in operation 108 of method 100, a scaling factor is determined for each region (e.g., shrinkable regions 232 and 236 and non-shrinkable region 234) in IC design layout 200. A scaling factor (F) is calculated as a fraction P/Q, where Q corresponds to the dimension of each region in IC design layout 200 along the x direction, and P corresponds to the dimension of a corresponding region in IC design layout 300 along the x direction, P and Q being positive integers. Therefore, the scaling factor $F_1$ for shrinkable region 232 is defined as: $F_1=P_1/Q_1=(NW_1+NS_1+NW_2+NS_2)/(W_1S_1+W_2+S_2)$, the scaling factor $F_2$ for non-shrinkable region 234 is defined as: $F_2=P_2/Q_2=(NW_3+NS_3+NW_4+NS_4)/(W_3+S_3+W_4+S_4)$, and the scaling factor $F_3$ for shrinkable region 236 is defined as: $F_3=P_3/Q_3=(NW_5+NS_5+NW_6+NS_6)/(W_5+S_5+W_6+S_6)$. In some embodiments, the scaling factor $F_1$ is the same as the scaling factor $F_3$. In some embodiments, the scaling factor $F_1$ is different from the scaling factor $F_3$. The scaling factor $F_2$ for a non-shrinkable region is equal to 1 (that is equal to 100%). Once scaling factors for shrinkable regions (e.g., regions 232 and 236) and non-shrinkable regions (e.g., regions 234) in IC design layout 200 are determined, the calculated scaling factors are used to adjust geometries of other layout patterns including interconnect layout patterns 220a, 220b, 220c and 220d in IC design layout 200 and additional layers of interconnect layout patterns (not shown) over interconnect layout patterns 220a, 220b, 220c and 220d.

Referring to FIG. 1 and FIG. 4, in operation 110 of method 100, respective interconnect layout patterns 220a, 220b, 220c and 220d in IC design layout 200 are adjusted to provide interconnect layout patterns 320a, 320b, 320c and 320d for IC design layout 300. The dimensions and relative positions of interconnect layout patterns 220a, 220b, 220c, 220d are adjusted based on regions, that is, shrinkable regions 232, 236 or non-shrinkable region 234, where interconnect layout patterns 220a, 220b, 220c and 220d are placed in IC design layout 200 so as to accommodate the non-uniform scaling of gate layout patterns 210a, 210b, 210c, 210d, 210e and 210f in the x direction. By taking into consideration of the non-uniform scaling of gate layout patterns 210a, 210b, 210c, 210d, 210e and 210f, interconnect layout patterns 320a, 320b, 320c and 320d keep the shapes and relative positions of corresponding interconnect layout patterns 220a, 220b, 220c and 220d after layout migration.

Specifically, in order to perform layout migration for interconnect layout patterns 220a, 220b, 220c and 220d, the location of an interconnect layout pattern 220a, 220b, 220c, or 220d in IC design layout 200 is first identified, corresponding scaling factor(s) is/are then applied to shrink interconnect layout pattern 220a, 220b, 220c, or 220d, respectively. In instances where an entirety of an interconnect layout pattern 220a, 220b, 220c, or 220d is within a single region 232, 234 or 236 of IC design layout 200, the interconnect layout pattern 220a, 220b, 220c, or 220d is scaled in the x direction using a corresponding scaling factor for that particular shrinkable region. Therefore, if an interconnect layout pattern 220a, 220b, 220c, or 220d is entirely within a shrinkable region 232 or 236, the dimension of the interconnect layout pattern 220a, 220b, 220c, or 220d is scaled by multiplying the corresponding scaling factor (e.g., $F_1$ or $F_3$). If an interconnect layout pattern 220a, 220b, 220c, or 220d is within a non-shrinkable region 234, the dimension of the interconnect layout pattern 220a, 220b, 220c, or 220d in the x direction remains the same. In instances wherein an interconnect layout pattern 220a, 220b, 220c or 220d spans across a shrinkable region 232 or 236 and a non-shrinkable region 234 of IC design layout 200, a portion of interconnect layout pattern 220a, 220b, 220c, or 220d falling within shrinkable region 232 or 236 is scaled in the x direction using a corresponding scaling factor for that particular shrinkable region 232 or 236, and another portion of interconnect layout pattern 220a, 220b, 220c or 220d falling within non-shrinkable region 234 is unaltered.

The x-coordinates of interconnect layout patterns 220a, 220b, 220c and 220d are updated to new coordinates based on the locations of interconnect layout patterns 220a, 220b, 220c and 220d and dimension changes for different regions 232, 234, 236 in IC design layout 200, so that relative positions between interconnect layout patterns 320a, 320b, 320c and 320d and gate layout patterns 310a, 310b, 310c, 310d, 310f and 310e are maintained after layout migration. For example, when the leftmost point of gate layout pattern 210a is used as the origin of x-coordinate, for a point (e.g., T1) which is located within shrinkable region 232 and has a coordinate x1, the new coordinates x1' of T1 after layout migration is expressed as:

x1'=x1<(A %*D1), wherein A % is the location of T1 in shrinkable region 232, and D1 is the dimension change for shrinkable region 232 after layout migration.

For a point (e.g., T2) which is located within non-shrinkable region 234 and has a coordinate x2, because non-shrinkable region 234 has the same dimension before and after layout migration, the new coordinates x2' of T2 after layout migration is expressed as:

x2'=x2−(100%*D1)−(B %*0), wherein B % is the location of T2 in non-shrinkable region 234, and D1 is the dimension change for shrinkable region 232 after layout migration.

For a point (e.g., T3) which is located within shrinkable region 236 and has a coordinate x3, the new coordinates x3' of T3 after layout migration is expressed as:

X3'=x3−(100%*D1)−(100%*0)−(C %*D2), wherein C % is the location of T3 in shrinkable region 236, D1 is the dimension change for shrinkable region 232 after the layout migration, and D2 is the dimension change for shrinkable region 236 after layout migration.

In the present disclosure, the scaling factors for gate layout patterns in different regions of an existing IC design layout are chosen as a basis to shrink other layout patterns such as via layout patterns and interconnect layout patterns. This is because via layout patterns and interconnect layout patterns have higher scaling tolerance than the gate layout patterns, and applying the scaling factors obtained from the gate layout patterns to shrink the remaining layout patterns helps to prohibit physical contact between gate layout patterns which have the least scaling tolerance.

Operation 110 is repeated till all the remaining layout patterns in other layout layers (not shown) of IC design layout 200 are adjusted by applying corresponding scaling factors (e.g., scaling factors $F_1$, $F_2$, $F_3$) for different regions (e.g., regions 232, 234, 236) that are identified in operations 106 and 108.

Referring to FIG. 1 and FIG. 5, in operation 112 of method 100, a design rule check is applied to interconnect layout patterns 320a, 320b, 320c and 320d. The design rule check applies one or more design rules for the second technology node to interconnect layout patterns 320a, 320b, 320c and 320d. For example, the design rule check examines the dimensions of interconnect layout patterns 320a, 320b, 320c and 320d in the x direction to ensure that the dimensions of interconnect layout patterns 320a, 320b, 320c and 320d comply with legal values associated with the second technology node. If a size of an interconnect layout pattern 320a, 320b, 320c or 320d in the x direction is not compliant with a legal value, the size of that interconnect layout pattern 320a, 320b, 320c and 320d in the x direction is snapped the nearest legal value. In some embodiments and as shown, the width of interconnect layout pattern 320c and the width of a portion of interconnect layout pattern 320d overlapping gate layout pattern 310f that are not compliant with legal values associated with the second technology node are snapped to the nearest legal values, respectively.

Operation 112 is repeated until legalities of all the layout patterns in IC design layout 300 are checked.

Although operations 106-112 of method 100 are described with respect to layout migration along the x direction, in some embodiments, operations 106-116 of method 100 are applicable to non-uniformly scale the layout patterns along the y direction. In some embodiments, the layout patterns are uniformly scaled along the y direction.

Figure 6:
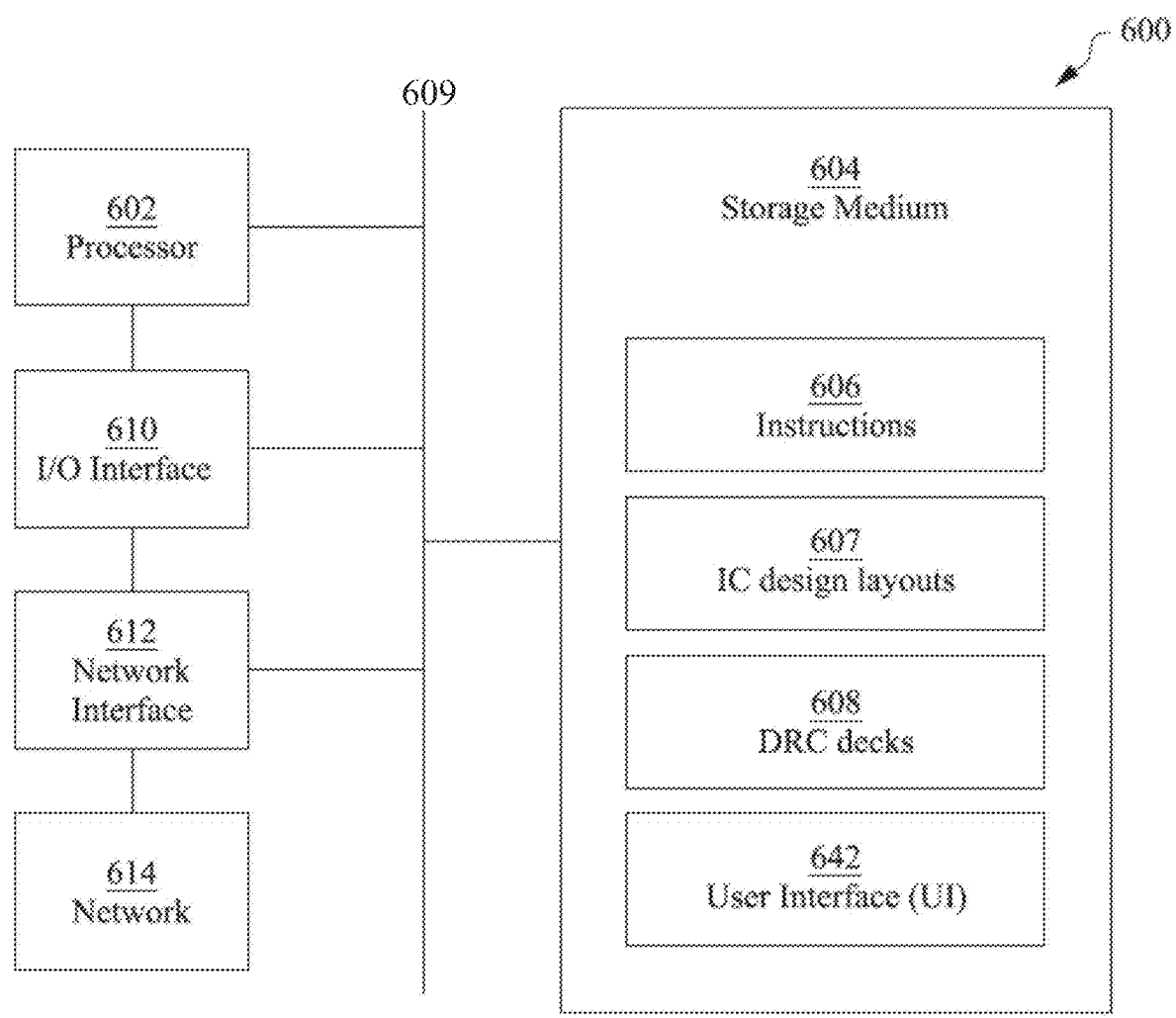
FIG. 6 is a schematic view of a system for designing an integrated circuit layout design, in accordance with some embodiments.

FIG. 6 is a block diagram of an electronic design automation (EDA) system 600, in accordance with some embodiments. Methods described herein of generating a target IC design layout, e.g., IC design layout 300 from an existing IC design layout, e.g., IC design layout 200, in accordance with one or more embodiments, are implementable, for example, using EDA system 600, in accordance with some embodiments. In some embodiments, EDA system 600 is a general purpose computing device including a hardware processor 602 and a non-transitory, computer-readable storage medium 604. Computer-readable storage medium 604, amongst other things, is encoded with, i.e., stores, a set of executable instructions 606, IC design layouts 607, design rule check (DRC) decks 608 or any intermediate data for executing the set of instructions. Each IC design layout 607 comprises a graphical representation of an integrated chip, such as for example, a GSII file. Each DRC deck 608 comprises a list of design rules specific to a semiconductor process chosen for fabrication of an IC design layout 607. Execution of instructions 606, IC design layouts 607 and DRC decks 608 by hardware processor 602 represents (at least in part) an EDA tool which implements a portion or all of, e.g., the methods described herein in accordance with one or more (hereinafter, the noted processes and/or methods).

Processor 602 is electrically coupled to computer-readable storage medium 604 via a bus 609. Processor 602 is also electrically coupled to an I/O interface 610 by bus 609. A network interface 612 is also electrically connected to processor 602 via bus 609. Network interface 612 is connected to a network 614, so that processor 602 and computer-readable storage medium 604 are capable of connecting to external elements via network 614. Processor 602 is configured to execute instructions 606 encoded in computer-readable storage medium 604 in order to cause EDA system 600 to be usable for performing a portion or all of the noted processes and/or methods. In one or more embodiments, processor 602 is a central processing unit (CPU), a multi-processor, a distributed processing system, an application specific integrated circuit (ASIC), and/or a suitable processing unit.

In one or more embodiments, computer-readable storage medium 604 is an electronic, magnetic, optical, electromagnetic, infrared, and/or a semiconductor system (or apparatus or device). For example, computer-readable storage medium 604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 604 includes a compact disk-read only memory (CD-ROM), a compact disk-read/write (CD-R/W), and/or a digital video disc (DVD).

In one or more embodiments, computer-readable storage medium 604 stores instructions 606, IC design layouts 607 and DRC decks 608 configured to cause EDA system 600 (where such execution represents (at least in part) the EDA tool) to be usable for performing a portion or all of the noted processes and/or methods. In one or more embodiments, storage medium 604 also stores information which facilitates performing a portion or all of the noted processes and/or methods.

EDA system 600 includes I/O interface 610. I/O interface 610 is coupled to external circuitry. In one or more embodiments, I/O interface 610 includes a keyboard, keypad, mouse, trackball, trackpad, touchscreen, and/or cursor direction keys for communicating information and commands to processor 602.

EDA system 600 also includes network interface 612 coupled to processor 602. Network interface 612 allows EDA system 600 to communicate with network 614, to which one or more other computer systems are connected. Network interface 612 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 600.

EDA system 600 is configured to receive information through I/O interface 610. The information received through I/O interface 610 includes one or more of instructions, data, design rules, libraries of standard cells, and/or other parameters for processing by processor 602. The information is transferred to processor 602 via bus 609. EDA system 600 is configured to receive information related to a user interface (UI) 642 through I/O interface 610. The information is stored in computer-readable medium 604 as UI 642.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 600. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 7:
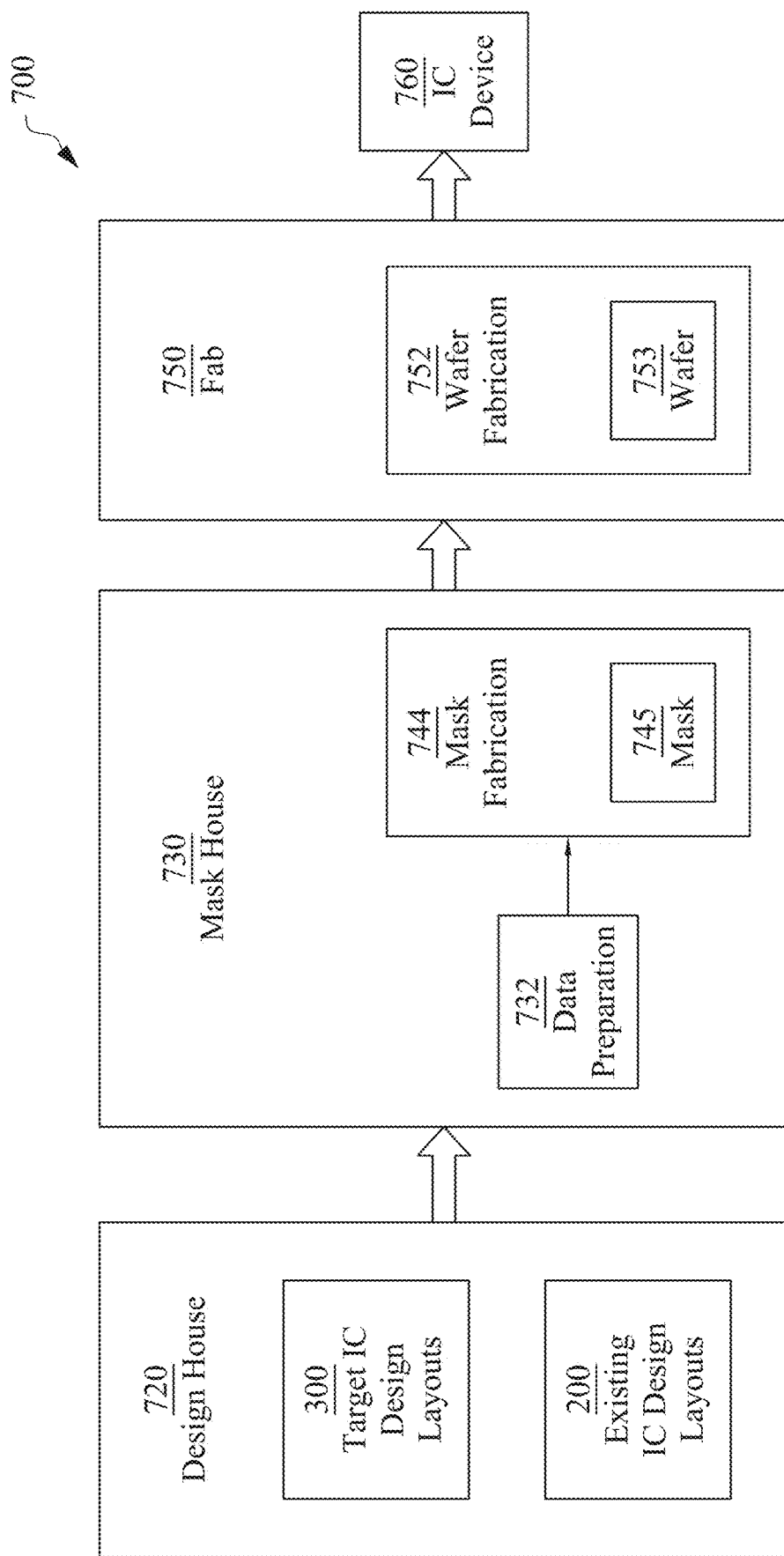
FIG. 7 is a block diagram of a manufacturing system for making integrated circuits, according to some embodiments.

Referring to FIG. 1 and FIG. 7, in operation 114 of method 100, once IC design layout 300 is generated, a mask or a set of masks 745 are fabricated based on IC design layout 300.

Still referring to FIG. 1 and FIG. 7, in operation 116 of method 100, an IC device 760 is fabricated based on IC design layout 300 using the mask or the set of masks 745 produced in operation 114.

FIG. 7 is a block diagram of an IC manufacturing system 700, and an IC manufacturing flow associated therewith, in accordance with some embodiments. In some embodiments, based on IC design layout 300, at least one of one or more semiconductor masks or at least one component in a layer of a semiconductor integrated circuit is fabricated using manufacturing system 700.

In FIG. 7, IC manufacturing system 700 includes entities, such as a design house 720, a mask house 730, and an IC manufacturer/fabricator ("fab") 750, that interact with one another in the design, development, and manufacturing cycles and/or services related to manufacturing IC device 760. The entities in IC manufacturing system 700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 720, mask house 730, and IC fab 750 are owned by a single larger company. In some embodiments, two or more of design house 720, mask house 730, and IC fab 750 coexist in a common facility and use common resources.

Design house (or design team) 720 generates a target IC design layout, e.g., IC design layout 300, from an existing design layout, e.g., IC design layout 200, via layout migration by implementing the method 100 described above.

Mask house 730 includes data preparation 732 and mask fabrication 744. Mask house 730 uses IC design layout 300 to manufacture one or more masks 745 to be used for fabricating the various layers of IC device 760 according to IC design layout 300. Mask house 730 performs mask data preparation 732, where IC design layout 300 is translated into a representative data file ("RDF"). Mask data preparation 732 provides the RDF to mask fabrication 744. Mask fabrication 744 includes a mask writer. A mask writer converts the RDF to an image on a substrate, such as a mask (reticle) 745 or a semiconductor wafer 753. IC design layout 300 is manipulated by mask data preparation 732 to comply with particular characteristics of the mask writer and/or requirements of IC fab 750. In FIG. 7, mask data preparation 732 and mask fabrication 744 are illustrated as separate elements. In some embodiments, mask data preparation 732 and mask fabrication 744 can be collectively referred to as mask data preparation.

In some embodiments, mask data preparation 732 includes optical proximity correction (OPC) which uses lithography enhancement techniques to compensate for image errors, such as those that can arise from diffraction, interference, other process effects and the like. OPC adjusts IC design layout 300. In some embodiments, mask data preparation 732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 732 includes a mask rule checker (MRC) that checks IC design layout 300 that has undergone processes in OPC with a set of mask creation rules which contain certain geometric and/or connectivity restrictions to ensure sufficient margins, to account for variability in semiconductor manufacturing processes, and the like. In some embodiments, the MRC modifies IC design layout diagram 300 to compensate for limitations during mask fabrication 744, which may undo part of the modifications performed by OPC in order to meet mask creation rules.

In some embodiments, mask data preparation 732 includes lithography process checking (LPC) that simulates processing that will be implemented by IC fab 750 to fabricate IC device 760. LPC simulates this processing based on IC design layout 300 to create a simulated manufactured device, such as IC device 760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 300.

It should be understood that the above description of mask data preparation 732 has been simplified for the purposes of clarity. In some embodiments, data preparation 732 includes additional features such as a logic operation (LOP) to modify IC design layout 300 according to manufacturing rules. Additionally, the processes applied to IC design layout 300 during data preparation 732 may be executed in a variety of different orders.

After mask data preparation 732 and during mask fabrication 744, a mask 745 or a group of masks 745 are fabricated based on IC design layout 300. In some embodiments, mask fabrication 744 includes performing one or more lithographic exposures based on IC design layout 300. In some embodiments, an electron-beam (e-beam) or a mechanism of multiple e-beams is used to form a pattern on a mask (e.g., a photomask, or a reticle) 745 based on IC design layout 300. Mask 745 can be formed in various technologies. In some embodiments, mask 745 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque regions and transmits through the transparent regions. In one example, a binary mask version of mask 745 includes a transparent substrate (e.g., fused quartz) and an opaque material (e.g., chromium) coated in the opaque regions of the binary mask. In another example, mask 745 is formed using a phase shift technology. In a phase shift mask (PSM) version of mask 745, various features in the pattern formed on the phase shift mask are configured to have proper phase difference to enhance the resolution and imaging quality. In various examples, the phase shift mask can be attenuated PSM or alternating PSM. The mask(s) generated by mask fabrication 744 is used in a variety of processes. For example, such a mask(s) is used in an ion implantation process to form various doped regions in semiconductor wafer 753, in an etching process to form various etching regions in semiconductor wafer 753, and/or in other suitable processes.

IC fab 750 includes wafer fabrication 752. IC fab 750 is an IC fabrication business that includes one or more manufacturing facilities for the fabrication of a variety of different IC products. In some embodiments, IC Fab 750 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 750 uses mask(s) 745 fabricated by mask house 730 to fabricate IC device 760. Thus, IC fab 750 at least indirectly uses IC design layout 300 to fabricate IC device 760. In some embodiments, semiconductor wafer 753 is fabricated by IC fab 750 using mask(s) 745 to form IC device 760. In some embodiments, the IC fabrication includes performing one or more lithographic exposures based at least indirectly on IC design layout 300. Semiconductor wafer 753 includes a silicon substrate or other proper substrate having material layers formed thereon. Semiconductor wafer 753 further includes one or more of various doped regions, dielectric features, multilevel interconnects, and the like (formed at subsequent manufacturing steps).

Details regarding an integrated circuit (IC) manufacturing system (e.g., IC manufacturing system 700 of FIG. 7), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

One aspect of this description relates to a method of modifying an integrated circuit (IC) design layout. The method includes receiving a first IC design layout of a first integrated circuit in a first technology node. The first IC design layout includes a plurality of first gate layout patterns spaced apart from one another along a first direction and a plurality of first interconnect layout patterns connecting the plurality of first gate layout patterns. The first IC design layout includes at least one shrinkable region and at least one non-shrinkable region. The method further includes obtaining a plurality of second gate layout patterns from the plurality of first gate layout patterns according to a set of design rules associated with a second technology node different from the first technology node. The method further includes determining a plurality of scaling factors for the first IC design layout in the first direction based on the plurality of first gate layout patterns and the plurality of second gate layout patterns. Each scaling factor of the plurality of scaling factors corresponds to one of the at least one shrinkable region and the at least one non-shrinkable region. The method further includes adjusting the plurality of first interconnect layout patterns along the first direction using the plurality of scaling factors to determine a plurality of second interconnect layout patterns connecting the plurality of second gate layout patterns. In some embodiments, determining the plurality of scaling factors includes comparing a pitch of each first gate layout pattern of the plurality of first gate layout patterns with a pitch of a corresponding second gate layout pattern of the plurality of second gate layout patterns. In some embodiments, determining the plurality of scaling factors further includes determining a first group of the plurality of first gate layout patterns being in the at least one shrinkable region and a second group of the plurality of first gate layout patterns being in the at least one non-shrinkable region. The first group of the plurality of first gate layout patterns being in the at least one shrinkable region has a scaling factor less than 1, and the second group of the plurality of gate layout patterns being in the at least one non-shrinkable region has a scaling factor equal to 1. In some embodiments, determining the first group of the plurality of first gate layout patterns being in the at least one shrinkable region and the second group of the plurality of first gate layout patterns being in the at least one non-shrinkable region includes calculating the scaling factor of the first group of the plurality of first gate layout patterns. The scaling factor of the first group of the plurality of first gate layout patterns is calculated as a fraction of P/Q, where Q corresponds to a sum of pitches of the first group of the plurality of first gat layout patterns, and P corresponds to a sum of pitches of a corresponding group of the plurality of second gat layout patterns. In some embodiments, adjusting the plurality of first interconnect layout patterns includes shrinking a portion of a first interconnect layout pattern of the plurality of first interconnect layout patterns in the at least one shrinkable region using a corresponding scaling factor of the at least one shrinkable region, while keeping another portion of the first interconnect layout pattern of the plurality of first interconnect layout patterns in the at least one non-shrinkable region unaltered. In some embodiments, adjusting the plurality of first interconnect layout patterns includes adjusting a dimension and a location of each first interconnect layout pattern of the plurality of first interconnect layout patterns. In some embodiments, the method further includes conducting a design rule check on the plurality of second interconnect layout patterns. In some embodiments, the method further includes snapping a size of a second interconnect layout pattern of the plurality of second interconnect layout patterns that fails to comply with the set of design rules associated with the second technology node to a nearest legal value. In some embodiments, the method further includes adjusting additional layout patterns of the first IC design layout along the first direction using the plurality of scaling factors. The additional layout patterns of the first IC design layout includes at least one additional layer of interconnect layout patterns over the plurality of first interconnect layout patterns.

Another aspect of this description relates to a method of processing an integrated circuit (IC) design layout. The method includes receiving a first IC design layout of a first integrated circuit in a first technology node. The first IC design layout comprises a plurality of first gate layout patterns spaced apart from one another along a first direction and extended along a second direction different from the first direction, and a plurality of first interconnect layout patterns connecting the plurality of first gate layout patterns. The first IC design layout includes a plurality of shrinkable regions and a plurality of non-shrinkable regions. The method further includes obtaining a plurality of second gate layout patterns from the plurality of first gate layout patterns according to a set of design rules associated with a second technology node different from the first technology node. The method further includes determining a plurality of first scaling factors for the first IC design layout in the first direction by comparing the plurality of first gate layout patterns and the plurality of second gate layout patterns. Each scaling factor of the plurality of first scaling factors corresponds to one of the plurality of shrinkable region and the plurality of non-shrinkable regions. The method further includes adjusting the plurality of first interconnect layout patterns along the first direction using the plurality of first scaling factors to determine a plurality of second interconnect layout patterns connecting the plurality of second gate layout patterns. The method further includes implementing a second IC design layout comprising the plurality of second gate layout patterns and the plurality of second interconnect layout patterns on a chip. In some embodiments, obtaining the plurality of second gate layout patterns includes adjusting a width and a length of at least one first gate layout pattern of the plurality of first gate layout patterns and spacings between adjacent first gate layout patterns of the plurality of first gate layout patterns according to a predefined scaling table. In some embodiments, the method further includes conducting a design rule check on the plurality of second interconnect layout patterns. In some embodiments, the method further includes snapping a size of a second interconnect layout pattern of the plurality of second interconnect layout patterns that fails to comply with the set of design rules associated with the second technology node to a nearest legal value. In some embodiments, the method further includes determining a plurality of second scaling factors for the first IC design layout along the second direction. In some embodiments, determining the plurality of second scaling factors includes comparing a pitch of each first gate layout pattern of the plurality of first gate layout patterns with a pitch of a corresponding second gate layout pattern of the plurality of second gate layout patterns along the second direction. In some embodiments, the method further includes adjusting the plurality of first interconnect layout patterns along the second direction using the plurality of second scaling factors.

Still another aspect of this description relates to a system for processing an integrated circuit (IC) design layout. The system includes at least one processor, and a computer readable storage medium connected to the at least one processor. The at least one processor is configured to execute instructions stored on the computer readable storage medium to receive a first IC design layout of a first integrated circuit in a first technology node. The first IC design layout includes a plurality of first gate layout patterns spaced apart from one another along a first direction and a plurality of first interconnect layout patterns connecting the plurality of first gate layout patterns. The first IC design layout includes at least one shrinkable region and at least one non-shrinkable region. The at least one processor is further configured to obtain a plurality of second gate layout patterns from the plurality of first gate layout patterns according to a set of design rules associated with a second technology node different from the first technology node. The at least one processor is further configured to determine a plurality of scaling factors for the first IC design layout along the first direction based on the plurality of first gate layout patterns and the plurality of second gate layout patterns. Each scaling factor of the plurality of scaling factors corresponds to one of the at least one shrinkable region and the at least one non-shrinkable region. The at least one processor is further configured to adjust the plurality of first interconnect layout patterns along the first direction using the plurality of scaling factors to determine a plurality of second interconnect layout patterns connecting the plurality of second gate layout patterns. In some embodiments, the at least one processer is further configured to conduct a design rule check on the plurality of second interconnect layout patterns. In some embodiments, the at least one processer is further configured to snap a size of a second interconnect layout pattern of the plurality of interconnect layout patterns that fails to comply with the set of design rules associated with the second technology node to a nearest legal value. In some embodiments, the at least one processor is further configured to implement a second IC design layout comprising the plurality of second gate layout patterns and the plurality of second interconnect layout patterns on a chip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of modifying an integrated circuit (IC) design layout, comprising:
   receiving a first IC design layout of a first integrated circuit in a first technology node, wherein the first IC design layout comprises a plurality of first gate layout patterns spaced apart from one another along a first direction and a plurality of first interconnect layout patterns connecting the plurality of first gate layout patterns, and the first IC design layout includes at least one shrinkable region and at least one non-shrinkable region;
   obtaining a plurality of second gate layout patterns from the plurality of first gate layout patterns according to a set of design rules associated with a second technology node different from the first technology node;
   determining a plurality of scaling factors for the first IC design layout in the first direction based on the plurality of first gate layout patterns and the plurality of second gate layout patterns, wherein each scaling factor of the plurality of scaling factors corresponds to one of the at least one shrinkable region and the at least one non-shrinkable region; and
   adjusting the plurality of first interconnect layout patterns along the first direction using the plurality of scaling factors to determine a plurality of second interconnect layout patterns connecting the plurality of second gate layout patterns.

2. The method of claim 1, wherein determining the plurality of scaling factors comprises comparing a pitch of each first gate layout pattern of the plurality of first gate layout patterns with a pitch of a corresponding second gate layout pattern of the plurality of second gate layout patterns.

3. The method of claim 2, wherein determining the plurality of scaling factors further comprises determining a first group of the plurality of first gate layout patterns being in the at least one shrinkable region and a second group of the plurality of first gate layout patterns being in the at least one non-shrinkable region, wherein the first group of the plurality of first gate layout patterns being in the at least one shrinkable region has a scaling factor less than 1, and the second group of the plurality of first gate layout patterns being in the at least one non-shrinkable region has a scaling factor equal to 1.

4. The method of claim 3, wherein determining the first group of the plurality of first gate layout patterns being in the at least one shrinkable region and the second group of the plurality of first gate layout patterns being in the at least one non-shrinkable region comprises calculating the scaling factor of the first group of the plurality of first gate layout patterns, wherein the scaling factor of the first group of the plurality of first gate layout patterns is calculated as a fraction of P/Q, where Q corresponds to a sum of pitches of the first group of the plurality of first gate layout patterns, and P corresponds to a sum of pitches of a corresponding group of the plurality of second gate layout patterns.

5. The method of claim 1, wherein adjusting the plurality of first interconnect layout patterns comprises shrinking a portion of a first interconnect layout pattern of the plurality of first interconnect layout patterns in the at least one shrinkable region using a corresponding scaling factor of the at least one shrinkable region, while keeping another portion of the first interconnect layout pattern of the plurality of first interconnect layout patterns in the at least one non-shrinkable region unaltered.

6. The method of claim 1, wherein adjusting the plurality of first interconnect layout patterns comprises adjusting a dimension and a location of each first interconnect layout pattern of the plurality of first interconnect layout patterns.

7. The method of claim 1, further comprising conducting a design rule check on the plurality of second interconnect layout patterns.

8. The method of claim 6, further comprising snapping a size of a second interconnect layout pattern of the plurality of second interconnect layout patterns that fails to comply with the set of design rules associated with the second technology node to a nearest legal value.

9. The method of claim 1, further comprising adjusting additional layout patterns of the first IC design layout along the first direction using the plurality of scaling factors, wherein the additional layout patterns of the first IC design layout comprise at least one additional layer of interconnect layout patterns over the plurality of first interconnect layout patterns.

10. A method of processing an integrated circuit (IC) design layout, comprising:
    receiving a first IC design layout of a first integrated circuit in a first technology node, wherein the first IC design layout comprises a plurality of first gate layout patterns spaced apart from one another along a first direction and extended along a second direction different from the first direction, and a plurality of first interconnect layout patterns connecting the plurality of first gate layout patterns, and the first IC design layout includes a plurality of shrinkable regions and a plurality of non-shrinkable regions;
    obtaining a plurality of second gate layout patterns from the plurality of first gate layout patterns according to a set of design rules associated with a second technology node different from the first technology node;
    determining a plurality of first scaling factors for the first IC design layout in the first direction by comparing the plurality of first gate layout patterns and the plurality of second gate layout patterns, wherein each scaling factor of the plurality of first scaling factors corresponds to one of the plurality of shrinkable region and the plurality of non-shrinkable regions;
    adjusting the plurality of first interconnect layout patterns along the first direction using the plurality of first scaling factors to determine a plurality of second interconnect layout patterns connecting the plurality of second gate layout patterns; and
    implementing a second IC design layout comprising the plurality of second gate layout patterns and the plurality of second interconnect layout patterns on a chip.

11. The method of claim 10, wherein obtaining the plurality of second gate layout patterns comprises adjusting a width and a length of at least one first gate layout pattern of the plurality of first gate layout patterns and spacings between adjacent first gate layout patterns of the plurality of first gate layout patterns according to a pre-defined scaling table.

12. The method of claim 10, further comprising conducting a design rule check on the plurality of second interconnect layout patterns.

13. The method of claim 12, further comprising snapping a size of a second interconnect layout pattern of the plurality of second interconnect layout patterns that fails to comply with the set of design rules associated with the second technology node to a nearest legal value.

14. The method of claim 10, further comprising determining a plurality of second scaling factors for the first IC design layout along the second direction.

15. The method of claim 14, wherein determining the plurality of second scaling factors comprises comparing a pitch of each first gate layout pattern of the plurality of first gate layout patterns with a pitch of a corresponding second gate layout pattern of the plurality of second gate layout patterns along the second direction.

16. The method of claim 14, further comprising adjusting the plurality of first interconnect layout patterns along the second direction using the plurality of second scaling factors.

17. A system for processing an integrated circuit (IC) design layout, comprising:
  at least one processor; and
  a computer readable storage medium connected to the at least one processor, wherein the at least one processor is configured to execute instructions stored on the computer readable storage medium to:
    receive a first IC design layout of a first integrated circuit in a first technology node, wherein the first IC design layout comprises a plurality of first gate layout patterns spaced apart from one another along a first direction and a plurality of first interconnect layout patterns connecting the plurality of first gate layout patterns, and the first IC design layout includes at least one shrinkable region and at least one non-shrinkable region;
    obtain a plurality of second gate layout patterns from the plurality of first gate layout patterns according to a set of design rules associated with a second technology node different from the first technology node;
    determine a plurality of scaling factors for the first IC design layout along the first direction based on the plurality of first gate layout patterns and the plurality of second gate layout patterns, wherein each scaling factor of the plurality of scaling factors corresponds to one of the at least one shrinkable region and the at least one non-shrinkable region; and
    adjust the plurality of first interconnect layout patterns along the first direction using the plurality of scaling factors to determine a plurality of second interconnect layout patterns connecting the plurality of second gate layout patterns.

18. The system of claim 17, wherein the at least one processor is further configured to execute instructions on the computer readable storage medium to:
  conduct a design rule check on the plurality of second interconnect layout patterns.

19. The system of claim 18, wherein the at least one processor is further configured to execute instructions on the computer readable storage medium to:
  snap a size of a second interconnect layout pattern of the plurality of second interconnect layout patterns that fails to comply with the set of design rules associated with the second technology node to a nearest legal value.

20. The system of claim 17, wherein the at least one processor is further configured to execute instructions on the computer readable storage medium to:
  implement a second IC design layout comprising the plurality of second gate layout patterns and the plurality of second interconnect layout patterns on a chip.

* * * * *